(12) United States Patent
Marquot et al.

(10) Patent No.: US 6,636,402 B1
(45) Date of Patent: Oct. 21, 2003

(54) HIGH VOLTAGE PROTECTION CIRCUIT

(75) Inventors: Alexis Marquot, Arenthon (FR); Philippe Bauser, Segny (FR)

(73) Assignee: Motorola, Inc., Schaumburg, IL (US)

( * ) Notice: Subject to any disclaimer, the term of this patent is extended or adjusted under 35 U.S.C. 154(b) by 497 days.

(21) Appl. No.: 09/610,786

(22) Filed: Jul. 6, 2000

(30) Foreign Application Priority Data

Jul. 24, 1999 (GB) .............................................. 9917383

(51) Int. Cl.[7] ................................................ H02H 3/20
(52) U.S. Cl. ........................ 361/91.1; 257/549; 257/371
(58) Field of Search ........................ 361/91.1; 257/549, 257/371, 372, 373, 375, 376, 548, 550

(56) References Cited

U.S. PATENT DOCUMENTS 5,497,023 A * 3/1996 Nakazato et al. ............ 257/394
5,679,971 A   10/1997 Tamba et al. ................ 257/357
6,055,205 A * 4/2000 Rao et al. .............. 365/230.06

* cited by examiner

Primary Examiner—Gregory J. Toatley, Jr.
Assistant Examiner—James Demakis
(74) Attorney, Agent, or Firm—Robert L. King

(57) ABSTRACT

A high voltage protection circuit (20) in a non-volatile memory includes a first transistor (22) and a second transistor (24) each formed in their own separate wells. A high voltage supply (Vhv) is provided at the drain of the second transistor (24). The source (40) of second transistor (24) is connected to the drain of first transistor (22) and to well (32), and the gate of the second transistor (24) is connected to Vdd, the main power supply to the chip. By forming the transistors in their own separate wells with the source of the second transistor (24) connected to its own well, breakdown of the circuit is governed by the sum of BVdss of the first transistor (22) and a gate induced breakdown (BVind) of the second transistor (24). With this circuit use of even a low Vdd (e.g. <3V) on the gate of the second transistor (24) is sufficient to protect against unwanted exposure to Vhs or to prevent leakage so that a higher stand-off voltage need not be generated and routed to the circuit.

6 Claims, 1 Drawing Sheet

HIGH VOLTAGE PROTECTION CIRCUIT

FIELD OF THE INVENTION

The present invention relates to integrated circuits in general, and more specifically to a circuit used to protect against high voltages as may be used, for example, in programming or erasing a nonvolatile memory.

BACKGROUND OF THE INVENTION

Non-volatile memories generally require a much higher voltage to write or erase a memory cell than is used as the main power supply to the chip. For example, the main supply voltage to the chip (Vdd) may be 3V or 5V, while an erase or programming operation requires application of 12–48V on the drain and/or [drain] of the transistor to be written. Charge pumps are typically employed to generate the higher voltages from the main power supply voltage. During a write operation, it is important that those memory cells which are not to be written are protected from the higher voltage. Furthermore, operation of the charge pumps can be quite sensitive to leakage such that protection circuits are sometimes needed to prevent such leakage.

One conventional protection circuit utilises two transistor in series, with the goal being that these transistors remain in their off state during application of the programming voltage. A simplified circuit diagram of such a protection circuit is shown in FIG. 1. A high voltage protection circuit 10 includes a first transistor 12 whose gate and source of transistor 12 are coupled to ground or Vss. The circuit also includes a second transistor 14 having its drain coupled to the high voltage being supplied (Vhv), its source coupled to the drain of transistor 12, and its gate coupled to a voltage labeled Vcas, because transistor 14 is also sometimes referred to as a cascode transistor. When Vhv is applied, second transistor 14 remains in an off state and shields transistor 12 from Vhv, which might otherwise be higher than the breakdown voltage of transistor 12. Second transistor 14 provides protection by ensuring that the voltage at the drain of first transistor 12 is below the breakdown voltage of transistor 12. This is ensured when the source of second transistor 14, and thus the drain of first transistor 12, does not rise above a voltage level equal to Vcas minus the threshold voltage (Vth) of second transistor 14.

Traditionally, Vcas was equal to Vdd, the main power supply voltage of the chip, because routing of this voltage to the protection circuit was very easy since the supply voltage is present in virtually every part of the chip. However, with the advancement of semiconductor manufacturing processes came the need for lower supply voltages (e.g. <3V), such that using Vdd as Vcas no longer offered high voltage protection because second transistor 14 would prematurely breakdown, thereby exposing first transistor 12 to Vhv.

To improve the performance of protection circuit 10, Vcas can be raised to a voltage higher than Vdd but lower than Vhv. This intermediate voltage is sometimes referred to as a "stand-off" voltage (Vso) which is also generated from a charge pump. While Vso can be chosen to offer effective breakdown and high voltage protection, use of an intermediate voltage requires additional circuitry to generate Vso and additional routing to route Vso to all the protection transistors in the memory array. This additional circuitry and routing adversely affects chip size, which in turn increases manufacturing costs. Accordingly, it would be desirable to have a high voltage protection with minimum additional routing and circuitry which can be used in conjunction with integrated circuits having very low power supply voltages (e.g. <3V).

DETAILED DESCRIPTION OF THE DRAWING

In accordance with the present invention, two transistors formed in separate wells are used in a high voltage protection circuit which allows the chip's supply voltage (Vdd) to be used as the gate voltage on the one of the protection transistors. By being able to use Vdd to prevent transistor breakdown, additional circuitry needed to generate a higher standoff voltage, and routing to bring the stand-off voltage to protection transistors is eliminated. Details of the invention and its advantages will be more apparent in reference to the description of FIGS. 2–5 below.

Figure 3:
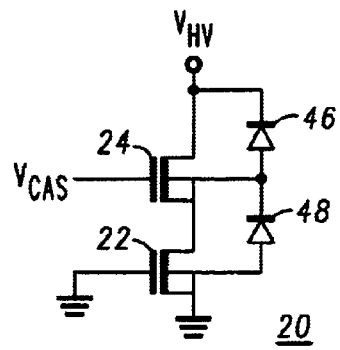
FIG. 3 is a circuit diagram illustrating the high voltage protection circuit of FIG. 2.
Figure 2:
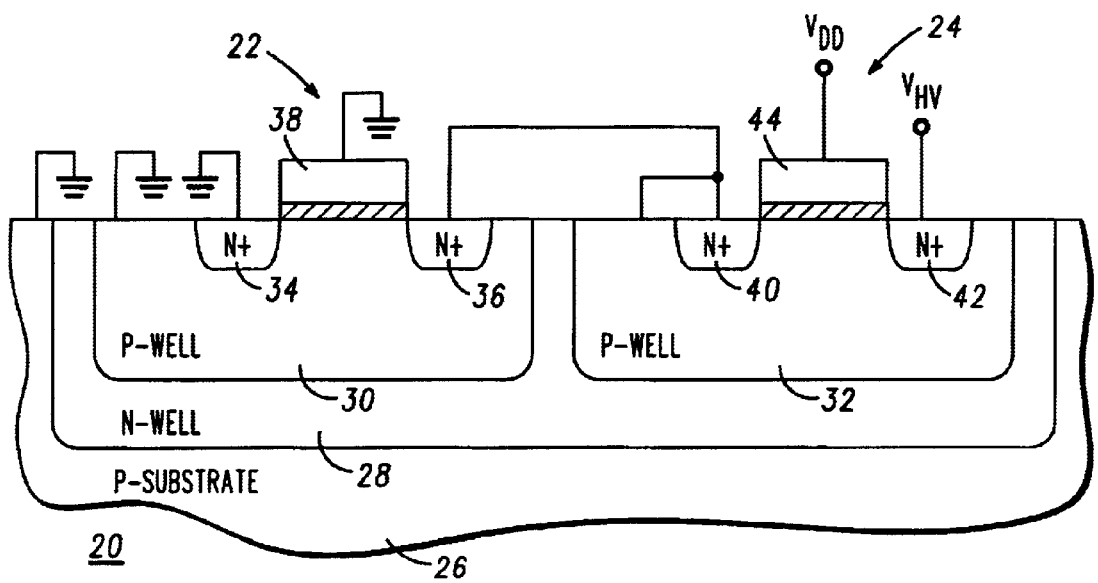
FIG. 2 is a cross-sectional view of a portion of an integrated circuit which includes a high voltage protection circuit in accordance with the present invention.
Figure 4:
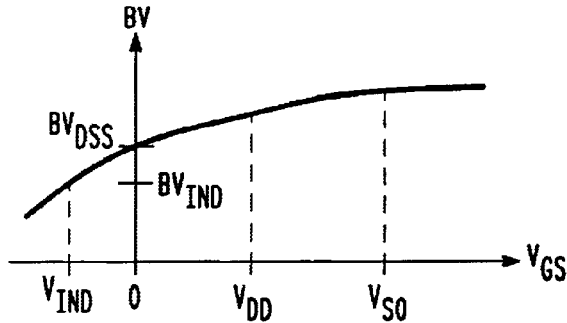
FIG. 4 is a graph illustrating the breakdown voltage of a transistor as a function of Vcas applied to the gate of a protection transistor.

FIG. 2 illustrates a protection circuit 20, shown in a partial cross-sectional view, in accordance with the invention. Protection circuit 20 includes a first transistor 22 and a second transistor 24, and is comprised of a bulk P-type substrate 26, an N-well formed in the bulk substrate, and two separate P-wells 30 and 32 formed within the N-well. First transistor 22 is an N-type transistor (NMOS) formed within P-well 30, having a source electrode 34, a drain electrode 36, and a gate electrode 38. Second transistor 24 is also an N-type transistor and is formed within P-well 32 and has a source electrode 40, a drain electrode 42, and a gate electrode 44. As illustrated, the source and gate of first transistor 22 are connected to ground (Vss) while the drain of first transistor 22 is connected to the source of second transistor 24. The gate of second transistor 24 is connected to the main power supply of the chip, Vdd, while the drain of second transistor 24 is connected to a high voltage, Vhv, such as one which would be used to program or erase a non-volatile memory cell. The source of second transistor 24 is connected the P-well 32. An equivalent circuit diagram of protection circuit 20 is shown in FIG. 3.

Figure 1:
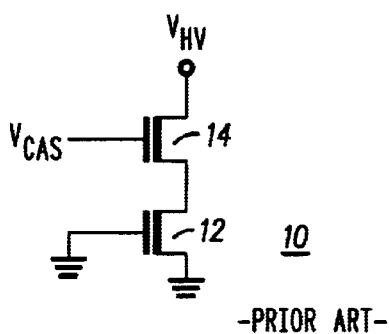
FIG. 1 is a circuit diagram illustrating a high voltage protection circuit in accordance with the prior art.

Because transistors 22 and 24 are formed in two separate wells and the well of transistor 24 is connected to its source, the breakdown conditions of the circuit are different than in the prior art protection circuit of FIG. 1. In protection circuit 20, breakdown is governed by the sum of the breakdown voltages of two diodes, diode 46 which is the junction of drain 42 and P-well 32 and diode 48 which is the junction of drain 36 and P-well 30. The breakdown voltage of diode 48 will be BVdss, which is the classic breakdown voltage between drain and the well or body of a transistor when the gate and source of the transistor are at the same potential. In a worse case scenario, the breakdown voltage of diode 46 will be something less than BVdss, call it a gate induced breakdown voltage (BVind), because the source potential of transistor 24 becomes higher than the gate potential (Vdd) of transistor 24 as diode 48 begins to breakdown. The breakdown characteristics of the two diodes may be better understood in reference to FIG. 4, which is a graph depicting the breakdown voltage (BV) between the drain of a transistor and its body as a function of the difference between the voltage applied to the gate of the transistor and the voltage at its source (Vgs). For diode 48, the gate and source of transistor 22 are at the same potential so that Vgs is 0. For diode 46, the worse case breakdown voltage is less than BVdss because there is a negative gate-to-source voltage difference. But transistors 22 and 24 will remain off and together provide high voltage protection so long as Vhv is less than BVdss+BVind. In many instances this level of protection is sufficient even if using a low Vdd (e.g. <3V) on the gate of transistor 24. Thus, additional circuitry and routing associated with use of a higher stand-off voltage is eliminated.

Figure 5:
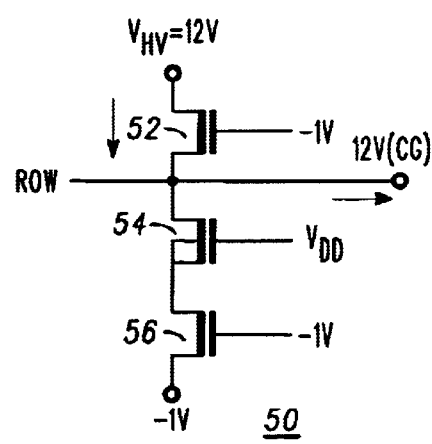
FIG. 5 is a circuit diagram illustrating a high voltage protection circuit in accordance with the present invention as it might be used in a non-volatile memory array.

FIG. 5 illustrates, in circuit diagram form, an example of how protection circuit 20 might be used in practice. A circuit 50 is used in a nonvolatile memory array (e.g. an EEPROM array) to select a row for a program or an erase operation. It is noted that this circuit would be replicated for each row in the array. Circuit 50 includes a P-type transistor 52 and two N-type transistors 54 and 56. A high voltage supply (Vhv) is provided by a charge pump (not shown) at the drain of transistor 52. As shown, Vhv equals 12V. A gate of transistor 52 is biased with −1V so that transistor 52 is in an "on" state and allows the 12V supply to pass to the control gates of the row. Transistors 54 and 56 are analogous to protection circuit 20 previously described. These transistors prevent the 12V supply from leaking, and thus prevent collapse of the charge pump used to generate the high voltage supply. In other embodiments, such transistors can be used to protect adjacent circuitry from exposure to a high voltage. It is noted that the voltage values provided are merely illustrative and in no way are intended to limit the application of the present invention.

As is apparent from the foregoing description and examples, the present invention relies upon the breakdown characteristics of two diodes in series which provide a synergistic level of high voltage protection and which can provide this protection without use of a stand-off voltage higher than Vdd. Even though one of the diodes may breakdown, the protection provided is equal to BVdss of the first transistor drain to body diode+BVind of the second transistor drain-to-body diode since the transistor are formed in separate wells. Thus in effect, the sum of the protection of the two diodes in series is greater than the sum of the individual effects of the diodes. While formation of the two transistors in separate wells increases the area needed to form the protection circuit as compared to the prior art circuit of FIG. 1, this increase can be less than would be needed to generate and route a stand-off voltage higher than Vdd. Accordingly, the invention provides a higher level of protection with a smaller overhead in silicon area as compared to prior art protection circuits, particularly in devices which have very low supply voltages (Vdd<3V).

Thus it is apparent that there has been provided, in accordance with the invention, a high voltage protection circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the invention. For example, the present invention is not limited to use in a non-volatile memory array, but can be used anywhere in an integrated circuit where circuitry needs to be shielded from exposure to a high voltage or where leakage needs to be tightly controlled (e.g. to avoid collapse of a charge pump). In addition, the invention is not limited to use with the precise voltage values mentioned. Furthermore, the invention is applicable to P-type protection devices as well as N-type devices. Therefore, it is intended that this invention encompass all such variations and modifications as fall within the scope of the appended claims.

What is claimed is:

1. A high voltage protection circuit in an integrated circuit comprising:

a first transistor of a first conductivity type having a gate, a source, and a drain; and a second transistor of the first conductive type having a source coupled to the drain of the first transistor, a gate for receiving a supply voltage of the integrated circuit, and a drain for receiving a high voltage which is higher than the supply voltage, wherein the first transistor is formed in a first well of a second conductivity type and the second transistor is formed in a second well of the second conductivity type, the first and second wells being separate from one another, wherein the source of the second transistor is also coupled to the second well, and the source of the first transistor and the first well of the second conductivity type are coupled to a same reference voltage terminal.

2. The circuit of claim 1 wherein the first conductivity type is N-type and the second conductivity type is P-type.

3. The circuit of claim 1 wherein the high voltage has a magnitude sufficiently high to write to a cell of a non-volatile memory array.

4. The circuit of claim 1 wherein the supply voltage is less than 3V.

5. A high voltage protection circuit in an integrated circuit non-volatile memory comprising:

a first transistor of N-type conductivity having a gate, a source, and a drain; and a second transistor of N-type conductivity having a source coupled to the drain of the first transistor, a gate for receiving a supply voltage of the integrated circuit, and a drain for receiving a high voltage which is higher than the supply voltage, wherein the first transistor is formed in a first well of P-type conductivity and the second transistor is formed in a second well of P-type conductivity, the first and second wells being separate from one another, wherein the source of the second transistor is also coupled to the second well and the source of the first transistor and the first well of P-type conductivity are each coupled to a reference terminal.

6. A high voltage protection circuit in an integrated circuit comprising:

a first transistor of a first conductivity type having a gate, a source, and a drain; and a second transistor of the first conductive type having a source coupled to the drain of the first transistor, a gate for receiving a supply voltage of the integrated circuit, and a drain for receiving a high voltage which is higher than the supply voltage, wherein the first transistor is formed in a first well of a second conductivity type and the second transistor is formed in a second well of the second conductivity type, the first and second wells being separate from one another, wherein the source of the second transistor is also coupled to the second well and the source of the first transistor and the first well of the second conductivity type are coupled to a same reference voltage terminal, breakdown conditions of the high voltage protection circuit being proportional to a sum of breakdown voltages of a first diode formed between the drain of the second transistor and the second well and a second diode formed between the drain of the first transistor and the first well.

* * * * *

UNITED STATES PATENT AND TRADEMARK OFFICE
CERTIFICATE OF CORRECTION

PATENT NO.    : 6,636,402 B1                                       Page 1 of 1
DATED         : October 21, 2003
INVENTOR(S)   : Alexis Marquot and Philippe Bauser It is certified that error appears in the above-identified patent and that said Letters Patent is hereby corrected as shown below:

<u>Column 4,</u>
Line 41, change "second well and" to -- second well, and --.

Signed and Sealed this

Twenty-seventh Day of July, 2004

JON W. DUDAS
*Acting Director of the United States Patent and Trademark Office*